(12) United States Patent  
Adem

(10) Patent No.: US 6,667,070 B1  
(45) Date of Patent: Dec. 23, 2003

(54) METHOD OF IN SITU MONITORING OF THICKNESS AND COMPOSITION OF DEPOSITED FILMS USING RAMAN SPECTROSCOPY

(75) Inventor: Ercan Adem, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/061,349

(22) Filed: Feb. 4, 2002

Related U.S. Application Data

(60) Provisional application No. 60/265,627, filed on Feb. 2, 2001.

(51) Int. Cl.[7] ............................................. C23C 16/52
(52) U.S. Cl. ........................................ 427/8; 427/248.1
(58) Field of Search ............................. 427/248.1, 8, 9, 427/10

(56) References Cited

U.S. PATENT DOCUMENTS 5,449,531 A * 9/1995 Zhu et al. ................. 427/249.8
5,772,760 A * 6/1998 Gruen et al. ................. 117/104

OTHER PUBLICATIONS

Bernard, M.C. et al., "In Situ Raman Study of the Corrosion of Zinc–Coated Steel in the Presence of Chloride". J. Electrochem Soc, vol. 142, No. 7, Jul. 1995, pp. 2162–2167.*

* cited by examiner

Primary Examiner—Bret Chen

(57) ABSTRACT

A novel method is provided for in situ monitoring of a film being deposited on a wafer for manufacturing a semiconductor device. The method involves producing an incident beam of radiation directed during a deposition process to a film being deposited on a wafer in a deposition reactor. The Raman scattered radiation resulted from interaction of the incident beam with molecules of the deposited film is detected to produce a Raman spectrum of the deposited film.

8 Claims, 1 Drawing Sheet

METHOD OF IN SITU MONITORING OF THICKNESS AND COMPOSITION OF DEPOSITED FILMS USING RAMAN SPECTROSCOPY

RELATED APPLICATIONS

This application claims priority from U.S. Provisional Patent Application No. 60/265,627, Filed Feb. 2, 2001.

FIELD OF THE INVENTION

The present application relates to semiconductor device manufacturing, and in particular, to in situ monitoring of deposition processes, such as LPCVD processes, using Raman spectroscopy.

BACKGROUND ART

Low-pressure chemical vapor deposition (LPCVD) is commonly used in fabrication of semiconductor devices for deposition of such materials as polysilicon, silicon dioxide ($SiO_2$), silicon nitride ($Si_3N_4$), etc. For example, commercial LPCVD equipment is available to deposit polysilicon on wafers up to eight inches in diameter. Up to 200 wafers may be loaded in a typical LPCVD reactor or furnace, which is based on a hot-wall, resistance-heated, horizontal fused-silica tube design. The temperature of the wafers in the furnace is controlled by heating the LPCVD tube. Typical deposition conditions are temperatures from 580° C. to 650° C. and pressures from 100 to 400 mTorr. The usual source gas is 100% silane, which decomposes at the surface to leave silicon behind.

The structure of the deposited polysilicon is a function of the deposition conditions. For the usual LPCVD conditions (e.g., 100% silane source gas at about 200 mTorr), amorphous silicon films are deposited below 580° C. and polycrystalline films are deposited above this temperature. As the deposition temperature increases in the polycrystalline range, the as deposited grain structure of the polysilicon films changes. At 600° C., the grains are very fine; at 625° C., the grains are well defined and can have a columnar structure perpendicular to the plane of the film. The grain size also tends to increase with film thickness. The crystal orientation of the polysilicon grains is dependent on the deposition temperature. For the standard LPCVD conditions (e.g., 100% silane source gas at 200 mTorr), the {110} orientation dominates between 600° C. and 650° C., whereas between 650° C. and 700° C., the {100} orientation dominates.

The electrical properties of polysilicon depend strongly on the grain structure of the film because the grain boundaries provide a potential barrier to the moving charge carriers and affect the conductivity of the films. The thermal conductivity of polysilicon is also a function of the grain structure of the deposited film. For fine grain films, the thermal conductivity is about 0.30–0.35 W/cm-K. This is 20–25% of the single-crystal value. For thicker films with larger grains, the thermal conductivity is between 50% and 85% of the single-crystal value.

Mechanical properties of polysilicon also depend on the deposition conditions. Thin films are generally under a state of stress, commonly referred to as residual stress. In semiconductor devices, the residual stress greatly affects the device performance. The as-deposited residual stress in the polysilicon film depends on the structure of the film. Polysilicon films are deposited in compressive stress the highest compressive stresses are in amorphous films, and polycrystalline films with a strong {110} texture. For films without a strong {110} texture, the stress tends to decrease with increasing temperature. Thicker films tend to have less stress.

As electrical and mechanical properties of films strongly depend on deposition conditions, it would be desirable to perform in situ monitoring of the thickness and composition of the film during the deposition process.

DISCLOSURE OF THE INVENTION

The present invention offers a novel method of in situ monitoring of a film being deposited on a wafer for manufacturing a semiconductor device. The method involves producing an incident beam of radiation directed during a deposition process to a film being deposited on a wafer in a deposition reactor. The Raman scattered radiation resulted from interaction of the incident beam with molecules of the deposited film is detected to produce a Raman spectrum of the deposited film.

In accordance with a preferable embodiment of the invention, a parameter of the deposited film determined based on the Raman spectrum may be compared with a predetermined range, to adjust the deposition process if the parameter is outside the predetermined range, which may be preprogrammed for a particular film to be deposited.

For example, the thickness of the deposited film determined based on the Raman spectrum may be compared with a predetermined thickness value to stop the deposition process if the thickness reaches the predetermined thickness. Also, crystal grain size of the deposited film determined based on the Raman spectrum may be compared with a predetermined size to increase the deposition temperature if the crystal grain size is less than the predetermined size. Further, the crystal orientation of the deposited film may be determined based on the Raman spectrum. If the crystal orientation is not correct, the deposition temperature may be adjusted to correct the crystal orientation.

Still other objects and advantages of the present invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

DETAILED DESCRIPTION OF THE INVENTION

Figure 1:
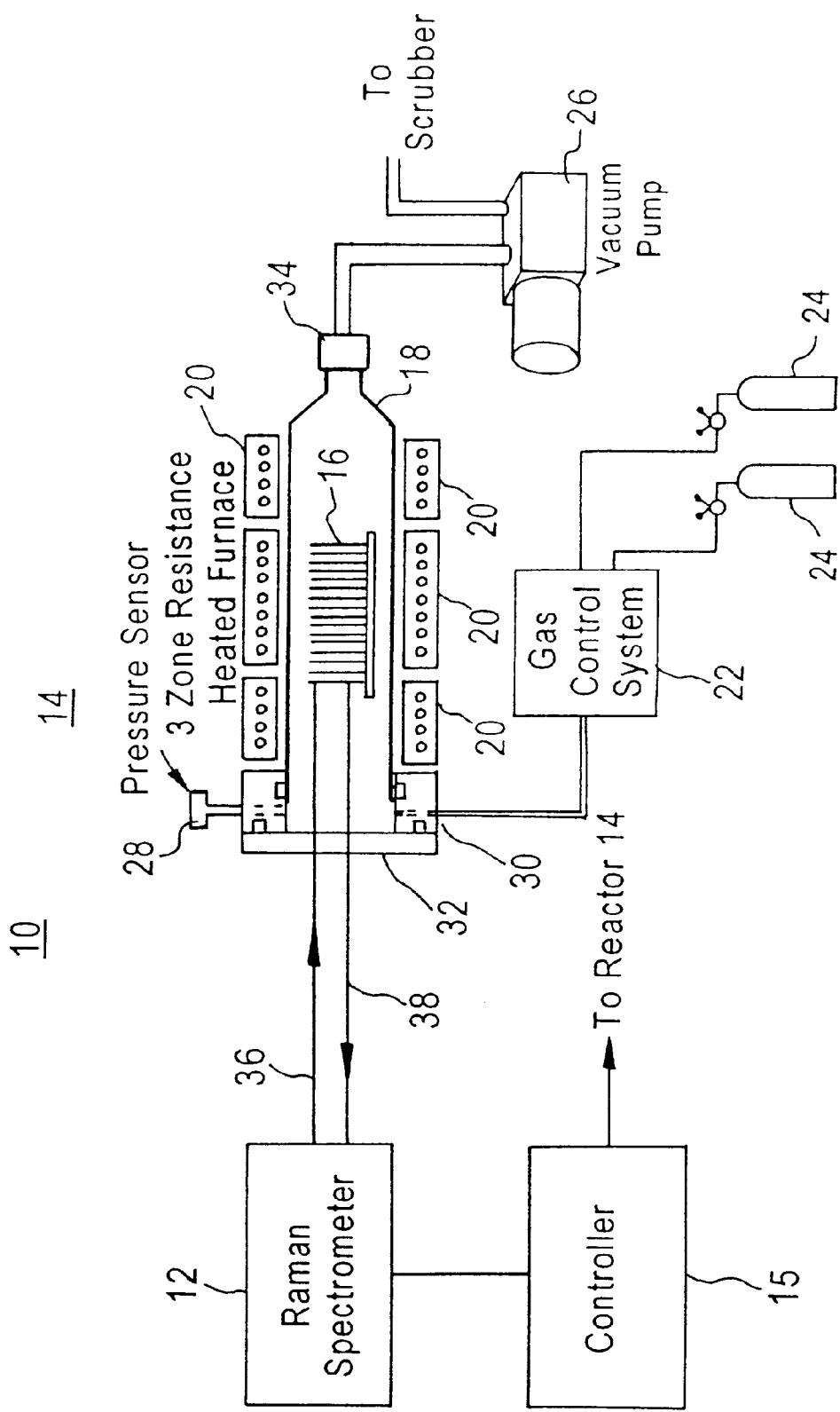
FIG. 1 schematically illustrates an exemplary in situ monitoring system for implementing the present invention.

Although the invention has general applicability for in situ monitoring of various deposition processes, a preferred embodiment of the invention is disclosed with an example of LPCVD deposition of polysilicon. FIG. 1 schematically illustrates an exemplary in situ monitoring system 10 for implementing the present invention.

The system 10 includes a Raman spectrometer 12, an LPCVD deposition reactor 14, and a deposition process controller 15. As described in more detail later, during the deposition process performed in the deposition reactor 14, the Raman spectrometer 12 monitors the thickness and composition of the films being deposited in the deposition reactor 14 to determine the Raman spectrum of the deposited films. Signals represented the Raman spectrum produced by the Raman spectrometer 12 are supplied to the deposition process controller 15 that determines the thickness and composition of the deposited films based on their Raman spectrum. When it detects that a selected parameter of the deposited film is outside a predetermined range, the controller 15 adjusts a deposition process performed in the deposition reactor 14. For example, it may stop the deposition process, or adjust a selected processing parameter of the deposition reactor 14, for example, the deposition temperature.

Wafers 16 are placed vertically in a quartz tube 18. Typical LPCVD deposition reactor may accept 100 to 200 wafers for deposition. The reactor 14 may comprise heated resistance elements 20 arranged along the walls of the reactor. To provide accurate control of the temperature in various areas of the reactor 14, multiple heating zones may be established along the walls of the tube 18. For example, the heated resistance elements 20 may be arranged to provide 3 heating zones.

A gas control system 22 controls supplying source gas 24 to the reactor 14. For example, 100% silane ($SiH_4$) may be used as the source gas 24. In addition, nitrogen may be used as a dilution gas for pressure control. A vacuum pump 26 may be provided for controlling pressure in the reactor 14. A pressure sensor 28 may be mounted for monitoring the pressure. Gas inlets 30 may be arranged at the front of the reactor 14 near a load door 32 provided for loading the wafers 16 into the tube 18. Outlet to the vacuum pump 26 may be arranged at the back end of the tube. A variable conductance valve 34 may be arranged at the outlet.

Typical deposition conditions are temperatures from 580° C. to 650° C. and pressures from 100 to 400 mTorr. Operating at reduced pressures enables a reaction-limited deposition process required to obtain uniform deposition across the wafers 16. In a reaction-limited deposition regime, the rate of film deposition is determined by the reaction rate of the reacting species on the wafer surface. For deposition at 630° C., the polysilicon deposition rate is typically near 100 Å/min. For deposition at lower temperatures, the deposition rate is lower.

Depletion of the source gas 24 may occur along the length of the tube 18. To keep the deposition rate uniform along the tube 18, the temperature is ramped so that the increased deposition rate offsets the reduction of the partial pressure of the source gas. Typical temperature ramps are from 5 to 15° C.

In a reaction-limited regime of deposition, precise control of temperature is required because the deposition rate is exponentially related to the temperature. As discussed above, the mechanical and electrical properties of the deposited polysilicon film are a function of processing parameters, including the deposition temperature. In accordance with the present invention, the Raman spectrometer 12 is provided for in situ monitoring of the thickness and composition of the deposited film during the deposition process, in order to enable accurate control of the deposition process if a selected monitored parameter of the deposited film is outside a predetermined range. For example, processing parameters, such as the deposition temperature, may be adjusted, or the deposition process may be stopped.

The Raman spectrometer 12 is mounted adjacent the load door 24 and contains a laser for emitting an incident light 36 directed through the load door 24 to the wafer 16. In accordance with the present invention, the load door 24 is made transparent so as to pass the incident beam 36 to the wafer 16. For example, the incident light 36 may be directed perpendicularly to surfaces of the wafers 16.

The Raman effect is based on the interaction of the incident light 36 with a material deposited on the wafers 16. When the incident light 36 described by an electric field E interacts with the deposited film, it induces a dipole moment $\mu$ in the molecules that compose the deposited film:

$$\mu = a \times E,$$

where a is the polarizability of the molecule describing the deformability of the molecule.

In order for a molecule to be Raman-active, it must possess a molecular bond with a polarizability that varies as a function of interatomic distance. Light striking a molecule with such a bond can be absorbed and then re-emitted at a different frequency (Raman-shifted) corresponding to the frequency of the vibrational mode of the bond. While most of the scattered light resulted from the incident light exciting molecules in the deposited films is at the same frequency as the incident light, some is Raman-shifted and scattered at a different frequency.

The Raman-shifted scattered light 38 passed through the transparent load door 32 is detected by the Raman spectrometer 12, which determines its intensity. Also, the Raman spectrometer 12 calculates the Raman shift as the energy difference between the incident light 36 and the Raman scattered light 38. As a result, the Raman spectrometer 12 determines the Raman spectrum of the films being deposited on the wafers 16 as a plot of Raman intensity versus Raman shift. Several different Raman-shifted signals may be observed by the Raman spectrometer 12. Each of them may be associated with different vibrational or rotational motions of molecules in the deposited films.

The Roman spectrum of the deposited films provides information on the thickness and composition of the films during the deposition process. As discussed above, the electrical and mechanical properties of a deposited film strongly depend on its thickness and composition. However, these film's parameters are affected by variations in the processing parameters during the deposition process.

In accordance with the present invention, during the deposition process, the Raman spectrometer 12 supplies the deposition process controller 15 with signals representing the Roman spectrum of the films being deposited. Based on the Roman spectrum, the controller 15 determines the thickness and composition of the deposited film, and compares these film's parameters with predetermined ranges. The predetermined ranges for the thickness and composition of a particular film to be deposited may be pre-programmed before the beginning of the deposition process.

When the controller 15 detects that a selected film's parameter is outside the range pre-programmed for a particular film, the controller 15 produces a control signal for adjusting the deposition process. For example, the controller 15 may stop the deposition process when the thickness of the deposited film is higher than the predetermined thickness value.

As discussed above, the structure of the deposited film, such as polysilicon, is a function of the deposition conditions. For example, the crystal grain size of the deposited film increases with the deposition temperature. Therefore, when during the deposition process, the deposition process controller 15 detects that the crystal grain size determined based on the Raman spectrum of the deposited film is below the predetermined value, it may increase the deposition temperature in the deposition reactor 14 to increase the crystal grain size.

Also, the crystal orientation of the polysilicon grains depends on the deposition temperature. For the standard LPCVD conditions (e.g., 100% silane source gas at 200 mTorr), the {110} orientation dominates between 600° C. and 650° C., whereas between 650° C. and 700° C., the {100} orientation dominates. Therefore, when during the deposition process, the controller 15 determines from the Raman spectrum of the deposited film that its crystal orientation is not correct, the controller 15 may change the deposition temperature to correct the crystal orientation of the deposited film.

Accordingly, the present invention enables in situ monitoring of the thickness and composition of deposited film during the deposition process to adjust the deposition process if a monitored film's parameter is outside a predetermined range.

Those skilled in the art will recognize that the present invention admits of a number of modifications, within the spirit and scope of the inventive concepts. For example, the Raman spectrometer 12, deposition reactor 14, and controller 15 may be implemented in a number of different ways. The Raman spectrometer 12 may be implemented as a compact Raman spectrometer capable of producing an incident beam directed at films deposited in the deposition reactor 14, and detecting the Raman scattered light resulted from the interaction of the incident beam with molecules of the deposited films. The deposition reactor 14 may be any chamber or furnace for performing thermal, LPCVD or CVD deposition of films. The controller 15 may be implemented as a specifically engineered chip having logic circuits and other components for performing the functions described above. Alternately, the controller 15 may be implemented using a general purpose digital signal processor and appropriate programming.

In this disclosure, there are shown and described only the preferred embodiments of the invention, but it is to be understood that the invention is capable of changes and modifications within the scope of the inventive concept as expressed herein.

What is claimed is:

1. Method of in situ monitoring of a film being deposited for manufacturing a semiconductor device, comprising the steps of:

during a deposition process, producing an incident beam of radiation directed to a film being deposited on a wafer in a deposition reactor, and detecting Raman scattered radiation resulted from interaction of the incident beam with molecules of the deposited film to produce a Raman spectrum of the deposited film.

2. The method of claim 1, further comprising the step of comparing a parameter of the deposited film determined based on the Raman spectrum with a predetermined range to adjust the deposition process if the parameter is outside the predetermined range.

3. The method of claim 2, wherein the predetermined range is preprogrammed for a particular film to be deposited.

4. The method of claim 2, wherein thickness of the deposited film determined based on the Raman spectrum is compared with a predetermined value to stop the deposition process if the thickness reaches the predetermined value.

5. The method of claim 2, wherein crystal grain size of the deposited film determined based on the Raman spectrum is compared with a predetermined value to increase deposition temperature if the crystal grain size is less than the predetermined value.

6. The method of claim 2, wherein crystal orientation of the deposited film is determined based on the Raman spectrum for adjusting deposition temperature to correct the crystal orientation.

7. The method of claim 2, wherein the deposition process is performed in a LPCVD reactor.

8. The method of claim 2, wherein the deposited film is a polysilicon film.

* * * * *